(12) United States Patent
Narumi

(10) Patent No.: US 11,171,434 B2
(45) Date of Patent: Nov. 9, 2021

(54) ELECTRIC CONNECTION SOCKET

(71) Applicant: Enplas Corporation, Saitama (JP)

(72) Inventor: Keiichi Narumi, Santa Clara, CA (US)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 16/761,253

(22) PCT Filed: Jun. 29, 2018

(86) PCT No.: PCT/JP2018/024820
§ 371 (c)(1),
(2) Date: May 3, 2020

(87) PCT Pub. No.: WO2019/049481
PCT Pub. Date: Mar. 14, 2019

(65) Prior Publication Data
US 2020/0350716 A1 Nov. 5, 2020

Related U.S. Application Data

(60) Provisional application No. 62/568,806, filed on Oct. 6, 2017, provisional application No. 62/555,793, filed on Sep. 8, 2017.

(51) Int. Cl.
*H01R 12/70* (2011.01)
*H01R 12/71* (2011.01)
(Continued)

(52) U.S. Cl.
CPC ....... *H01R 12/718* (2013.01); *G01R 1/06722* (2013.01); *G01R 1/07314* (2013.01); *H01R 12/57* (2013.01); *H01R 13/193* (2013.01)

(58) Field of Classification Search
CPC .. H01R 12/718; H01R 12/716; H01R 12/714; H01R 12/71; H01R 12/7076;
(Continued)

(56) References Cited

U.S. PATENT DOCUMENTS 5,990,697 A * 11/1999 Kazama ................. G01R 1/067
324/72.5
7,198,493 B2 * 4/2007 Chen ................. H01R 13/2442
439/66

(Continued)

FOREIGN PATENT DOCUMENTS

JP  2009-129877  6/2009
JP  2012-103028  5/2012
(Continued)

OTHER PUBLICATIONS

International Search Report and the Written Opinion dated Sep. 4, 2018 From the International Searching Authority Re. Application No. PCT/JP2018/024820 and Its Translation of Search Report Into English. (9 Pages).

*Primary Examiner* — Harshad C Patel

(57) ABSTRACT

An electric connection socket for relaying electric signals between a circuit substrate and an electric component includes: a metal housing which has a through hole enabling communication between the top surface and the bottom surface thereof, and on the top surface of which the electric component is mounted and on the bottom surface of which the circuit substrate is mounted; and a signal pin inserted into the through hole to configure a coaxial line between the inner wall surfaces of the through hole, and which is electrically connected at one end to a signal path pad electrode of the circuit substrate and is electrically connected at the other end to a signal path terminal of the electric component. The metal housing is arranged on the circuit substrate such that an air gap is formed between the bottom surface of the metal housing and the top surface of the circuit substrate.

10 Claims, 5 Drawing Sheets

(51) Int. Cl.
*G01R 1/067* (2006.01)
*G01R 1/073* (2006.01)
*H01R 12/57* (2011.01)
*H01R 13/193* (2006.01)

(58) Field of Classification Search
CPC .............. H01R 13/6315; H01R 13/193; H01R 13/187; H01R 13/17; H01R 13/10; G01R 1/6722; G01R 1/67; G01R 1/0433; G01R 1/0425; G01R 1/07314
USPC .... 439/700, 66, 68, 81, 91, 591, 70, 71, 74, 439/82
See application file for complete search history.

(56) References Cited

U.S. PATENT DOCUMENTS

| | | | | |
|---|---|---|---|---|
| 7,210,952 | B2* | 5/2007 | Ishida | H05K 7/1061 439/331 |
| 7,220,134 | B2* | 5/2007 | Goodman | H01R 13/2421 439/70 |
| 7,456,645 | B2* | 11/2008 | Yoshida | G01R 1/06722 324/755.02 |
| 7,654,827 | B2* | 2/2010 | Arai | H01R 13/2414 439/66 |
| 7,666,000 | B1* | 2/2010 | Hsiao | G01R 1/0466 439/66 |
| 7,690,925 | B2* | 4/2010 | Goodman | H01R 13/2421 439/70 |
| 7,845,955 | B2* | 12/2010 | Nakayama | G01R 1/07371 439/66 |
| 7,950,927 | B2* | 5/2011 | Kazama | G01R 3/00 439/66 |
| 8,758,066 | B2* | 6/2014 | Zhou | G01R 1/0675 439/700 |
| 8,957,693 | B2* | 2/2015 | Tsubaki | G01R 1/07314 324/756.02 |
| 2012/0182037 | A1* | 7/2012 | Tsubaki | G01R 1/0483 324/756.02 |
| 2013/0203298 | A1 | 8/2013 | Zhou et al. | |
| 2016/0268710 | A1* | 9/2016 | Zhang | H01R 12/7076 |
| 2017/0059611 | A1* | 3/2017 | Lesnikoski | G01R 1/045 |
| 2020/0366018 | A1* | 11/2020 | Koshiishi | G01R 1/045 |

FOREIGN PATENT DOCUMENTS

| | | |
|---|---|---|
| JP | 2015-507198 | 3/2015 |
| WO | WO 2019/049481 | 3/2019 |

* cited by examiner

ELECTRIC CONNECTION SOCKET

RELATED APPLICATIONS

This application is a National Phase of PCT Patent Application No. PCT/JP2018/024820 having International filing date of Jun. 29, 2018, which claims the benefit of priority under 35 USC § 119(e) of U.S. Provisional Patent Application Nos. 62/568,806 filed on Oct. 6, 2017 and 62/555,793 filed on Sep. 8, 2017. The contents of the above applications are all incorporated by reference as if fully set forth herein in their entirety.

FIELD AND BACKGROUND OF THE INVENTION

The present disclosure relates to an electrical connection socket.

An electrical connection socket that relays electric signals between an electric component (IC package, for example) and a circuit substrate (PCB substrate, for example) is known (see Patent Literature 1 (hereinafter, abbreviated as PTL), for example).

CITATION LIST

Patent Literature

PTL 1
Japanese Unexamined Patent Application Publication (Translation of PCT Application) No. 2015-507198

SUMMARY OF THE INVENTION

Such an electrical connection socket is required to relay high-frequency (10 GHz, for example) electric signals because of a recent demand for an increase of data transfer rate. Thus, in a recent electrical connection socket, a metal housing connected to the ground is used so that signal degradation can be suppressed. In the electrical connection socket, a signal pin that performs signal transmission is disposed in a through hole disposed to pass between the upper surface and the lower surface of the metal housing, and the signal pin constitutes a coaxial line by the signal pin and the inner wall surface of the through hole.

The electrical connection socket that uses the metal housing is, however, affected by crosstalk between the metal housing and the circuit substrate more easily than when a resin electrical connection socket according to an existing art is used, and thus, due to the crosstalk, signal transmission performance may decrease regardless of the connected state of the signal pin itself. Typically, due to the crosstalk, the ground voltage of the metal housing becomes in a unstable state. As a result, characteristic impedance of a signal path constituted by the signal pin becomes unstable, which may lead to signal degradation due to reflection in the signal path.

The present disclosure has been made in consideration of the aforementioned problems, and an object of the present disclosure is to provide an electrical connection socket capable suppressing crosstalk between a metal housing and a circuit substrate.

The present disclosure mainly solving the problem mentioned above is an electrical connection socket that relays an electric signal between a circuit substrate and an electric component, the electrical connection socket including:

a metal housing including a first through hole passing between an upper surface and a lower surface of the metal housing, the electric component being to be mounted on a side of the upper surface, the circuit substrate being to be disposed on a side of the lower surface; and a signal pin inserted into the first through hole to constitute a coaxial line together with an inner wall surface of the first through hole, the signal pin including a first end to be electrically connected to a signal-path-use first pad electrode of the circuit substrate and a second end to be electrically connected to a signal-path-use first terminal of the electric component, in which the metal housing is disposed on the circuit substrate such that an air gap is formed between the lower surface of the metal housing and an upper surface of the circuit substrate.

An electrical connection socket according to the present disclosure can suppress crosstalk between a metal housing and a circuit substrate.

DESCRIPTION OF SPECIFIC EMBODIMENTS OF THE INVENTION

A suitable embodiment of the present disclosure will be described below in detail with reference to the accompanying drawings. In the present description and the drawings, duplicate description of constituent components having functions substantially identical to each other is omitted by giving identical reference signs thereto.

[Overall Configuration of Electrical Connection Socket]

Hereinafter, with reference to FIG. 1 to FIG. 5, an example of the configuration of an electrical connection socket according to an embodiment will be described.

Figure 1:
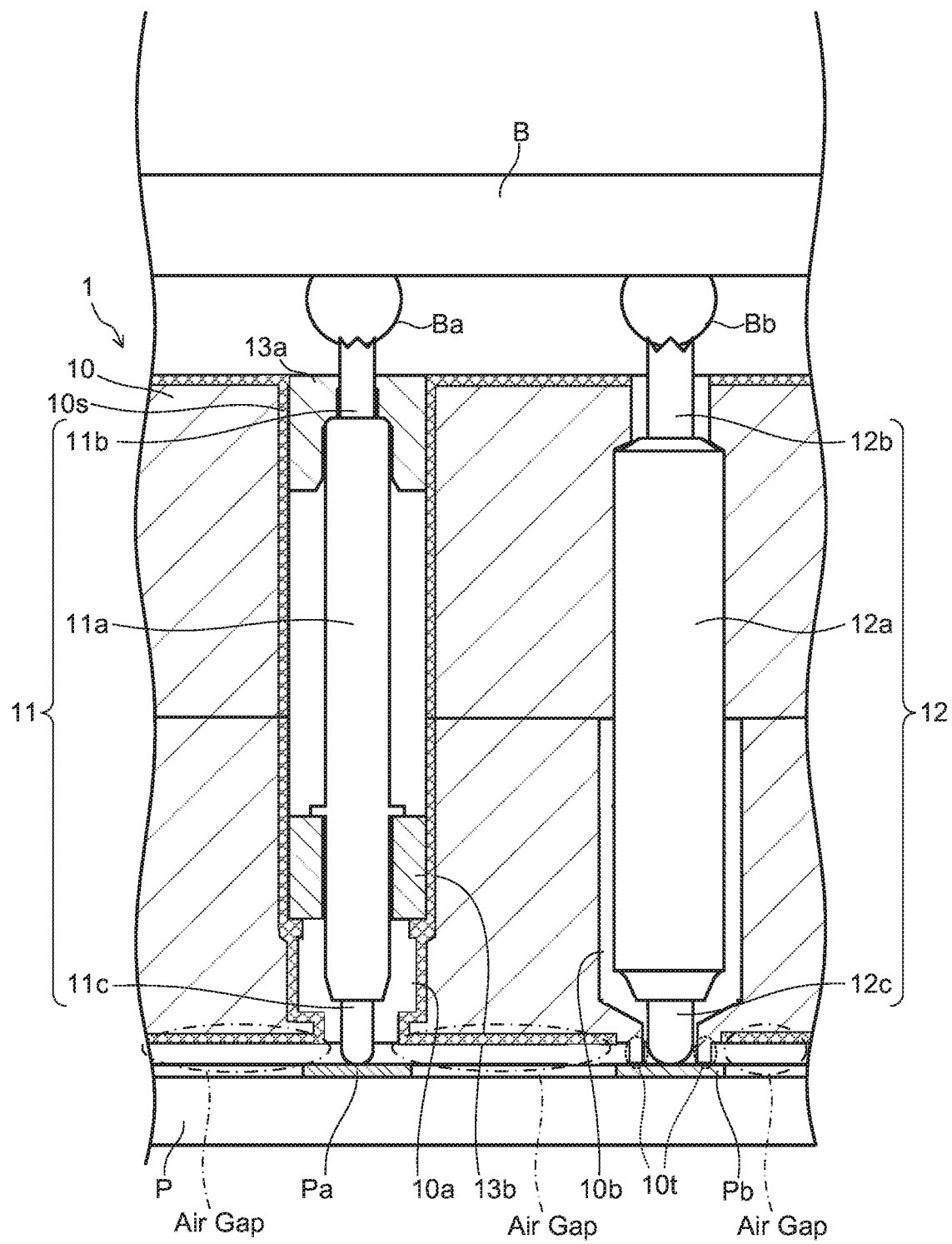
FIG. 1 is a side sectional view of an electrical connection socket according to an embodiment.

FIG. 1 is a side sectional view of electrical connection socket 1 according to the present embodiment.

Figure 2:
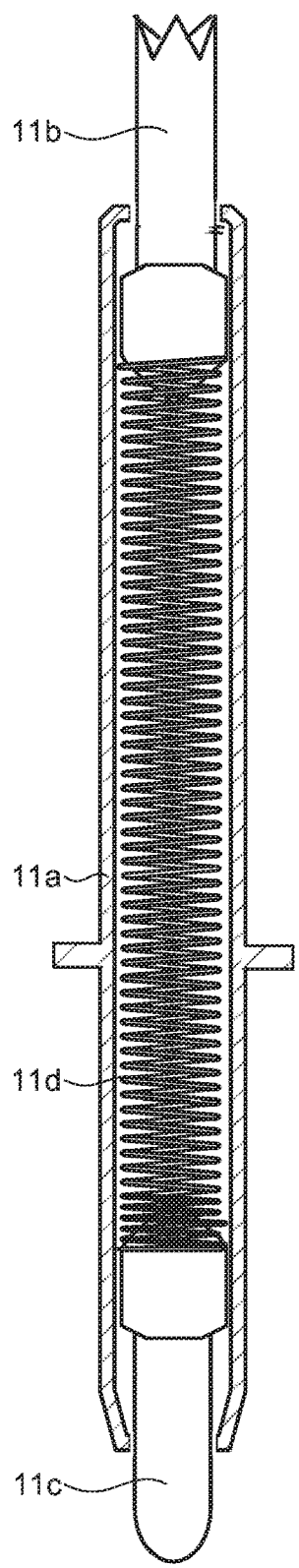
FIG. 2 is a side sectional view of a signal pin of the electrical connection socket according to an embodiment.
Figure 3:
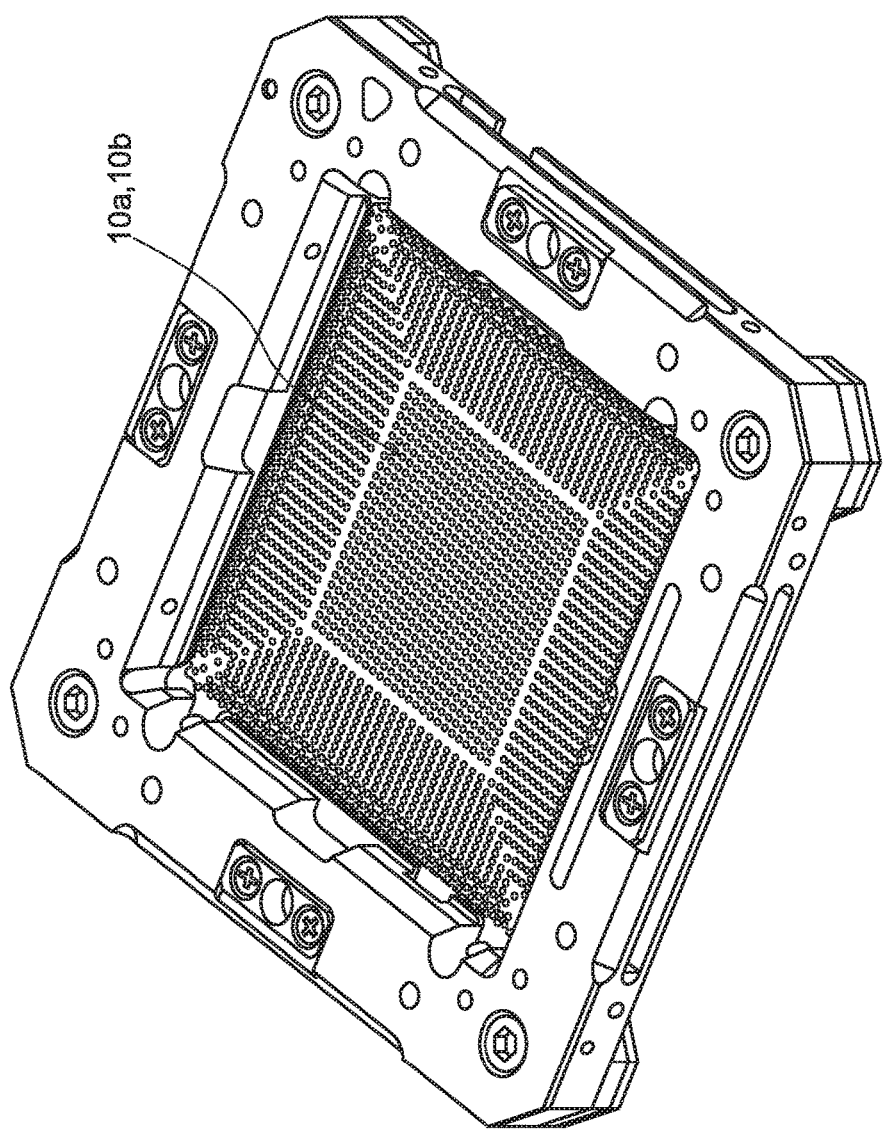
FIG. 3 is a perspective view in which a metal housing of the electrical connection socket according to an embodiment is viewed from the top.
Figure 4:
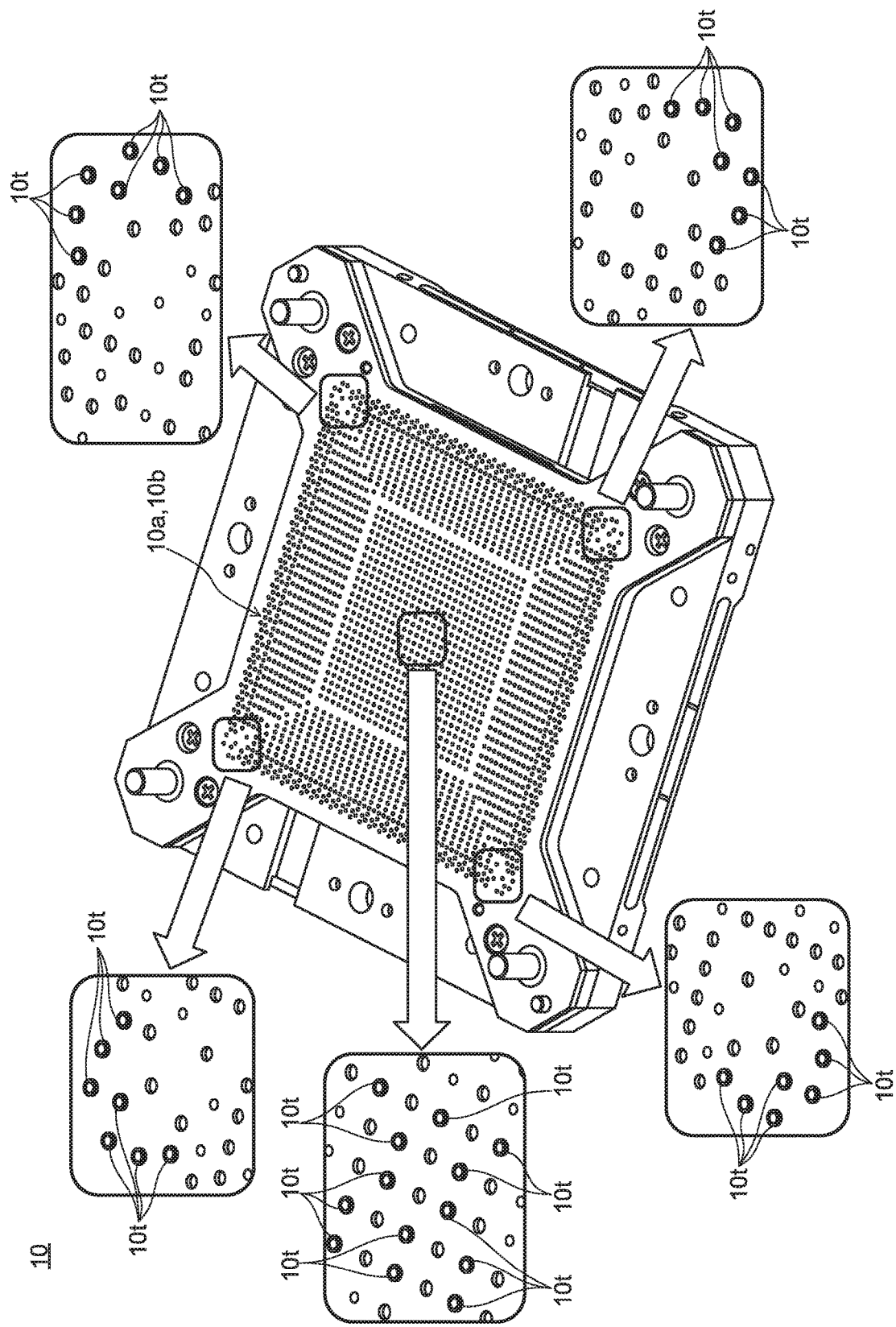
FIG. 4 is a perspective view in which the metal housing of the electrical connection socket according to an embodiment is viewed from the bottom.
Figure 5:
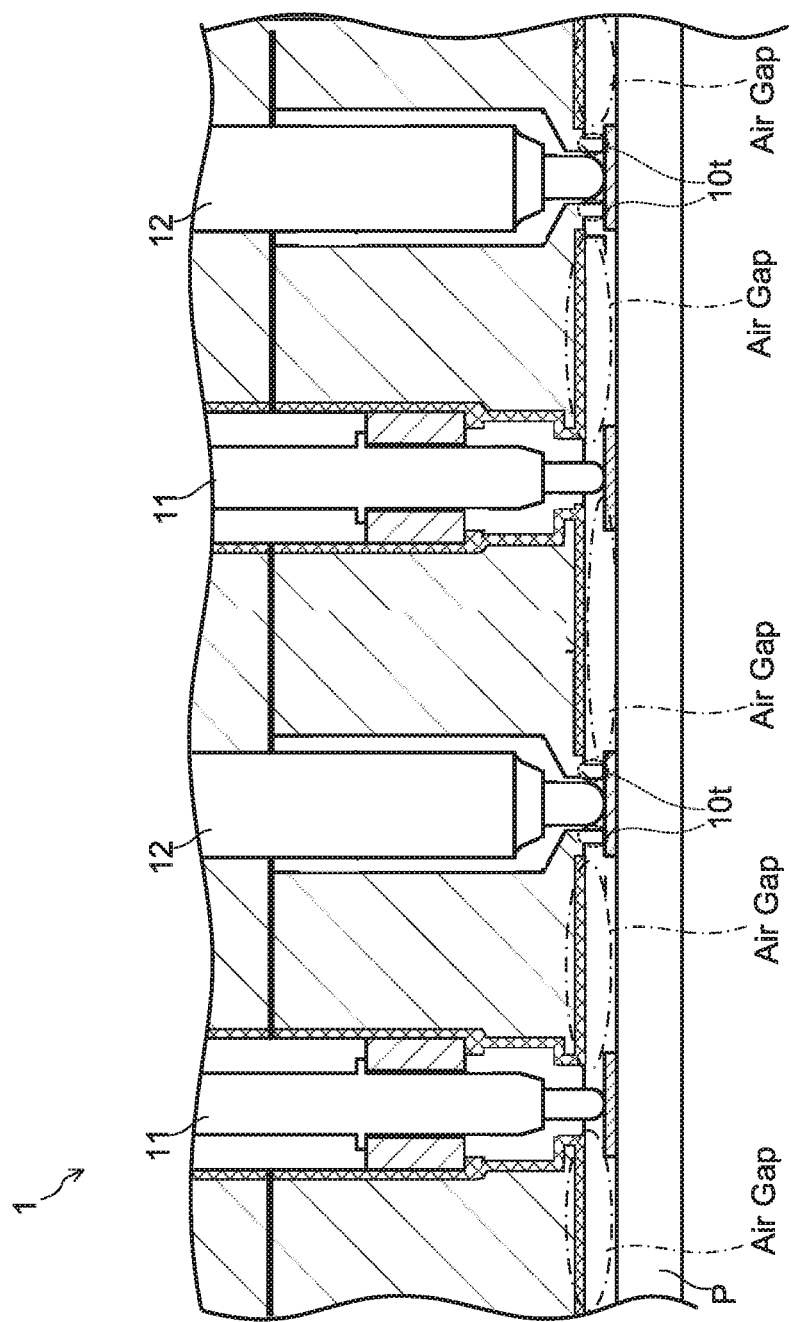
FIG. 5 illustrates air gaps formed on the lower surface side of the metal housing in the electrical connection socket according to an embodiment.

FIG. 2 is a side sectional view of signal pin 11 of electrical connection socket 1 according to the present embodiment. FIG. 3 is a perspective view in which metal housing 10 of electrical connection socket 1 according to the present embodiment is viewed from the top. FIG. 4 is a perspective view in which metal housing 10 of electrical connection socket 1 according to the present embodiment is viewed from the bottom. FIG. 5 illustrates air gaps formed on the lower surface side of metal housing 10 in electrical connection socket 1 according to the present embodiment.

Electrical connection socket 1 according to the present embodiment is a surface-mount type socket and to be mounted on circuit substrate P. IC package B is mounted on an upper portion of electrical connection socket 1. In the following description, the circuit substrate P side as viewed from electrical connection socket 1 is referred to as the lower side (corresponding to the lower side of FIG. 1), and the IC package B side is referred to as the upper side (corresponding to the upper side of FIG. 1).

Electrical connection socket 1 according to the present embodiment is applied to, for example, an intended use of performing a performance test of IC package B. Electrical connection socket 1 performs electrical connection between IC package B disposed on the upper surface side thereof and circuit substrate P of an IC test apparatus disposed on the lower surface side thereof. Incidentally, the most efficient method in which a data transfer rate is maintained is soldering IC package B directly to circuit substrate P; however, here, electrical connection using electrical connection socket 1 is employed to make circuit substrate P and IC package B detachable from each other.

IC package B is, for example, a BGA (Ball Grid Array)-type IC package. IC package B includes, for example, as terminals for external connection, signal-path-use first solder ball Ba (first terminal) and ground-connection-use second solder ball Bb (second terminal) that project downward from the lower surface of the body of the package.

IC package B is mounted on electrical connection socket 1 by a latch (not illustrated) disposed on electrical connection socket 1. In a state in which the latch is closed, IC package B is mounted on electrical connection socket 1 with the upper surface thereof being pressed. IC package B is detachable from electrical connection socket 1 by opening the latch.

Circuit substrate P is, for example, a PCB (Printed Circuit Board) substrate. For example, a signal-path-use circuit pattern that generates a signal for performing a performance test of IC package B and that performs reception processing of a signal from IC package B, a ground pattern for supplying a ground voltage, and the like are formed on circuit substrate P. On circuit substrate P, first pad electrode Pa connected to the signal-path-use circuit pattern and second pad electrode Pb connected to the ground pattern are formed in a state of being exposed from the surface of circuit substrate P.

Electrical connection socket 1 is mounted with respect to circuit substrate P by a bolt and a nut, and the like.

Electrical connection socket 1 includes, for example, metal housing 10, signal pin 11 that performs signal transmission between circuit substrate P and IC package B, and ground pin 12 that supplies a ground voltage from circuit substrate P to IC package B.

Metal housing 10 is formed of, for example, a metal member of aluminum or copper, and the like. Metal housing 10 has conductivity with, for example, the entirety thereof formed of aluminum, and a ground voltage ensured at projecting portion 10t (details will be described later) on the lower surface of metal housing 10 is supplied to the entirety of metal housing 10.

Metal housing 10 is constituted by an upper plate and a lower plate that are connected to each other by using fixing members (a bolt and a nut, for example). Metal housing 10 may be integrally constituted by a member or may be constituted by a plurality of plates joined to each other. Metal housing 10 may include a portion constituted by an insulation material.

Metal housing 10 includes first through hole 10a into which signal pin 11 is inserted and second through hole 10b into which ground pin 12 is inserted. Each of first through hole 10a and second through hole 10b is formed to pass from the upper surface to the lower surface of metal housing 10. First through hole 10a and second through hole 10b each have, for example, a circular shape in plan view.

In the exposed surface of metal housing 10, regions (hatched portions 10s in FIG. 1) that require electrical insulation are anodized. Here, the inner wall surface of first through hole 10a of metal housing 10, some portions of the lower surface of metal housing 10, and the upper surface of metal housing 10 are anodized regions 10s. Consequently, electrical insulation between metal housing 10 and signal pin 11, electrical insulation between metal housing 10 and circuit substrate P, and electrical insulation between metal housing 10 and IC package B are reinforced.

Signal pin 11 is disposed in first through hole 10a so as to be away from the inner wall surface of first through hole 10a. In other words, signal pin 11 is disposed in first through hole 10a in a state of being electrically insulated from metal housing 10 and constitutes a coaxial line between signal pin 11 and the inner wall surface of first through hole 10a. The distance between the outer circumferential surface of signal pin 11 (pin barrel 11a) and the inner wall surface of first through hole 10a is adjusted such that the characteristic impedance of the coaxial line constituted by signal pin 11 has a predetermined value (50Ω, for example) at each position. Having such a configuration, signal pin 11 provides an impedance-matched signal path between IC package B and circuit substrate P.

Signal pin 11 is configured to include pin barrel 11a, first plunger 11b, second plunger 11c, and spring 11d (see FIG. 2).

Pin barrel 11a is a cylindrical member and disposed in first through hole 10a to extend along first through hole 10a in the up-down direction. Pin barrel 11a is fixed in first through hole 10a in a state of being away from the inner wall surface of first through hole 10a due to, for example, holding members 13a and 13b having insulation.

Holding member 13a has an annular shape and is press-fitted on the upper side of first through hole 10a into first through hole 10a. Holding member 13b has an annular shape and is press-fitted on the lower side of pin barrel 11a to be locked to first through hole 10a. Pin barrel 11a is fixed via holding members 13a and 13b so as to be held from the upper and lower sides in first through hole 10a.

First plunger 11b is coupled to an upper end portion of pin barrel 11a in a state of being slidable in the up-down direction. First plunger 11b is configured such that a lower end portion thereof is connected to an upper end portion of spring 11d disposed in pin barrel 11a and an upper end portion thereof projects upward from an opening formed in the upper end portion of pin barrel 11a. The upper end portion of first plunger 11b projects upward more than the upper surface of metal housing 10. Due to such a configuration, when IC package B is mounted on electrical connection socket 1, the upper end portion of first plunger 11b is in contact with signal-path-use first solder ball Ba of IC package B. Consequently, electrical connection between signal pin 11 and the signal path in IC package B is performed. The upper end portion of first plunger 11b has a recessed shape extending along the outer shape of first solder ball Ba so as to come into contact with first solder ball Ba easily.

Second plunger 11c is coupled to a lower end portion of pin barrel 11a in a state of being slidable in the up-down direction. Second plunger 11c is configured such that an upper end portion thereof is connected to a lower end portion of spring 11d disposed in pin barrel 11a and a lower end portion thereof projects downward from an opening formed in the lower end portion of pin barrel 11a. The lower end portion of second plunger 11c projects downward more than the lower surface of metal housing 10. Due to such a configuration, when electrical connection socket 1 is mounted on circuit substrate P, the lower end portion of second plunger 11c is in contact with signal-path-use first pad electrode Pa formed on circuit substrate P. Consequently, electrical connection between signal pin 11 and the signal path in circuit substrate P is performed.

Spring 11d is disposed between first plunger 11b and second plunger 11c in pin barrel 11a and urges first plunger 11b in the up direction and urges second plunger 11c in the down direction. Consequently, a contact pressure between the upper end portion of first plunger 11b and first solder ball Ba of IC package B and a contact pressure between the lower end portion of second plunger 11c and first pad electrode Pa of circuit substrate P are ensured. Spring 11d is configured to be in contact with the inner wall surface of pin barrel 11a and electrically connects first plunger 11b, pin barrel 11a, and second plunger 11c to each other.

Pin barrel 11a, first plunger 11b, second plunger 11c, and spring 11d are each constituted by a metal member. As described above, these members are disposed in a state of being electrically insulated from the inner wall surface of first through hole 10a.

In such a configuration, when the upper end portion of first plunger 11b comes into contact with first solder ball Ba of IC package B and the lower end portion of second plunger 11c comes into contact with first pad electrode Pa of circuit substrate P, signal pin 11 relays a signal transmission between IC package B and circuit substrate P.

In second through hole 10b, ground pin 12 (pin barrel 12a) is disposed in contact with the inner wall surface of second through hole 10b. In other words, ground pin 12 is disposed in second through hole 10b in a state of being electrically connected at the inner wall surface of second through hole 10b to metal housing 10. More preferably, ground pin 12 is disposed to be electrically connected in an upper-side region in second through hole 10b to second through hole 10b.

Similarly to signal pin 11, ground pin 12 is configured to include pin barrel 12a, first plunger 12b, second plunger 12c, and a spring (not illustrated).

Ground pin 12 is constituted by a structure substantially identical to that of signal pin 11. In other words, when IC package B is mounted on electrical connection socket 1, an upper end portion of first plunger 12b is in contact with ground-use second solder ball Bb of IC package B, and a lower end portion of second plunger 12c is in contact with ground-use second pad electrode Pb formed on circuit substrate P. Consequently, a ground voltage of circuit substrate P is supplied to the ground pattern of IC package B via ground pin 12.

As described above, ground pin 12 is disposed in contact with the inner wall surface of second through hole 10b of metal housing 10.

For convenience of description, FIG. 1 shows only one signal pin 11 and one ground pin 12; however, electrical connection socket 1 includes a plurality of signal pins 11 and ground pins 12 similar to those in FIG. 1. FIG. 3 and FIG. 4 show a plurality of first through holes 10a and a plurality of second through holes 10b formed in metal housing 10, and signal pin 11 and ground pin 12 are inserted into each of first through holes 10a and each of second through holes 10b, respectively (illustration of signal pins 11 and ground pins 12 is omitted in FIG. 3 and FIG. 4). Electrical connection socket 1 may include a power pin for supplying operating power from circuit substrate P to IC package B.

[Configuration of Projecting Portion of Electrical Connection Socket]

Electrical connection socket 1 according to the present embodiment includes a plurality of projecting portion 10t that project downward from the lower surface of metal housing 10 such that air gaps (see FIG. 5) are formed between the lower surface of metal housing 10 and the upper surface of circuit substrate P. In other words, electrical connection socket 1 according to the present embodiment utilizes the air gaps to reduce crosstalk between the signal path formed on circuit substrate P and metal housing 10.

The plurality of projecting portions 10t are typically formed on the lower surface of metal housing 10 to have a ring shape so as to surround the respective periphery of the plurality of second through holes 10b (see FIG. 4). The plurality of projecting portions 10t are disposed, for example, in regions at four corners of the lower surface of metal housing 10 and a region at the center of the lower surface of metal housing 10 to support metal housing 10 from below.

The projecting height of projecting portion 10t is preferably set, for example, to cause the air gaps between the lower surface of metal housing 10 and the upper surface of circuit substrate P to be 0.1 mm or more. An area in which projecting portion 10t is disposed is preferably set to cause an air gap region to be 95% or more a region in which the lower surface of metal housing 10 and the upper surface of circuit substrate P face each other, even considering necessity of grounding of metal housing 10 by projecting portion 10t.

Projecting portion 10t also has a function of electrically connecting metal housing 10 directly to ground-use second pad electrode Pb of circuit substrate P. Similarly to metal housing 10, projecting portion 10t is constituted by a metal member (aluminum material, for example). The surface of projecting portion 10t is not anodized, and projecting portion 10t is in a state in which the metal member is exposed.

Projecting portion 10t is in contact at a lower end portion of projecting portion 10t with second pad electrode Pb in an outer peripheral region of a region in which ground pin 12 is in contact with second pad electrode Pb of circuit substrate P. Consequently, projecting portion 10t grounds metal housing 10.

Electrical connection socket 1 according to the present embodiment thus connects metal housing 10 to the ground via projecting portion 10t.

In an electrical connection socket according to an existing art, grounding of metal housing 10 is performed by contact between the outer circumferential surface of ground pin 12 and the inner wall surface of a through hole (first through hole 10a in FIG. 1, for example) of metal housing 10, and the grounding is performed via impedance generated due to contact resistance between the outer circumferential surface of ground pin 12 and the inner wall surface of through hole. This means that the configuration of projecting portion 10t according to the present embodiment enables metal housing 10 to be connected to the ground not via the impedance generated due to the contact resistance between the outer circumferential surface of ground pin 12 and the inner wall surface of first through hole 10a.

Consequently, it is possible to make the ground potential of metal housing 10 more stable, and it is thus possible to properly hold the characteristic impedance of the coaxial line constituted by signal pin 11. Consequently, it is also possible to suppress occurrence of signal interference between the signal pin 11 and the other signal pin 11.

Supplying of the ground voltage from projecting portion 10t is also performed for ground pin 12 via a contact portion between the inner wall surface of second through hole 10b and ground pin 12. In particular, in the present embodiment, ground pin 12 is disposed in a state of being away from the inner wall surface of second through hole 10b in a lower region of second through hole 10b and is disposed in contact with the inner wall surface of second through hole 10b in an upper region of second through hole 10b. Consequently, it is also possible to stabilize the ground potential in the upper region of ground pin 12, in which grounding becomes easily unstable.

Here, a form in which the air gaps are formed between the lower surface of metal housing 10 and the upper surface of circuit substrate P by projecting portion 10t is presented. The configuration for forming the air gaps, however, may be the other methods; for example, electrical connection socket 1 may be mounted on circuit substrate P such that the entirety of the lower surface of metal housing 10 is away from the upper surface of circuit substrate P.

[Usage Form of Electrical Connection Socket]

Next, a usage form of electrical connection socket 1 according to the present embodiment will be described.

First, electrical connection socket 1 is mounted on circuit substrate P. At this time, projecting portion 10t disposed on the lower surface of metal housing 10 comes into contact with ground-use second pad electrode Pb of circuit substrate P. Consequently, metal housing 10 is electrically connected directly to ground-use second pad electrode Pb of circuit substrate P and becomes in a state in which a stable ground voltage is ensured.

Next, IC package B is mounted on electrical connection socket 1. Then, when the upper surface of IC package B is pressed in the down direction by using the latch disposed on electrical connection socket 1, first solder ball Ba and second solder ball Bb of IC package B abut first plunger 11b of signal pin 11 and first plunger 12b of ground pin 12, respectively. Consequently, electrical contact between signal-path-use first solder ball Ba and first plunger portion 11b of signal pin 11 and electrical contact between ground-use second solder ball Bb and first plunger portion 12b of ground pin 12 are ensured.

In response to IC package B lowering, second plunger 11c of signal pin 11 and second plunger 12c of ground pin 12 respectively abut signal-path-use first pad electrode Pa and ground-use second pad electrode Pb that are on circuit substrate P. Consequently, electrical contact between signal-path-use first pad electrode Pa and second plunger portion 11c of signal pin 11 and electrical contact between ground-use second pad electrode Pb and second plunger portion 12c of ground pin 12 are ensured.

At this time, the urging force of spring 11d acts on each of first plunger portion 11b and second plunger portion 11c of signal pin 11 in a direction in which first plunger portion 11b and second plunger portion 11c are separated from each other in the up-down direction. Similarly, the urging force of the spring (not illustrated) acts on each of first plunger portion 12b and second plunger portion 12c of ground pin 12 in a direction in which first plunger portion 12b and second plunger portion 12c are separated from each other in the up-down direction. Consequently, a contact pressure between first and second solder balls Ba and Bb of IC package B and first plunger portions 11b and 12b of pins 11 and 12 and a contact pressure between first pad electrodes Pa and Pb of circuit substrate P and second plunger portions 11c and 12c of pins 11 and 12 are maintained in a properly ensured state.

By thus electrically connecting IC package B and circuit substrate P to each other via electrical connection socket 1, a performance test and the like of IC package B are performed. At this time, the ground voltage of metal housing 10 is held in a stable state, and signal transmission via signal pin 11 is thus performed in a state in which signal degradation is suppressed.

[Effects]

As described above, in electrical connection socket 1 according to the present embodiment, metal housing 10 is disposed on circuit substrate P such that the air gaps are formed between the lower surface of metal housing 10 and the upper surface of circuit substrate P. Therefore, electrical connection socket 1 according to the present embodiment enables crosstalk between metal housing 10 and circuit substrate P to be suppressed. Consequently, it is possible to suppress the ground potential of metal housing 10 from becoming unstable and suppress signal degradation during signal transmission.

In particular, electrical connection socket 1 according to the present embodiment includes the plurality of projecting portions 10t that project downward from the lower surface of metal housing 10 and that are disposed in contact with the upper surface of circuit substrate P and is configured such that the air gaps are formed in the regions between the plurality of projecting portions 10t. Consequently, it is possible to stabilize the supporting structure of metal housing 10 and perform grounding of metal housing 10 by projecting portions 10t.

OTHER EMBODIMENTS

The present invention is not limited to the aforementioned embodiment and can be variously modified.

In the aforementioned embodiment, as an example of the held form of signal pin 11, a form in which signal pin 11 is held so as to be away from the inner wall surface of first through hole 10a is presented. Signal pin 11 is, however, not limited thereto provided that signal pin 11 is electrically insulated from metal housing 10, and a configuration in which an insulation member is interposed between signal pin 11 and the inner wall surface of first through hole 10a may be employed. In addition, pin barrel 11a of signal pin 11 is not necessarily fixed; pin barrel 11a may be configured to be slidable in first through hole 10a.

In the aforementioned embodiment, as an example of the configuration of electrical connection socket 1, a form including ground pin 12 is presented. Electrical connection socket 1, however, may be configured not to include ground pin 12 in consideration of grounding of metal housing 10 to be performed by projecting portion 10t.

In the aforementioned embodiment, as an example of electric component B that is to be connected to the upper side of electrical connection socket 1, IC package B is presented. Electric component B to be connected to the upper side of electrical connection socket 1, however, may be a coaxial cable or the like.

In the aforementioned embodiment, as an example of the intended use of electrical connection socket 1, a form used for a test of IC package B is presented. Electrical connection socket 1 is, however, applicable as a matter of course to any intended uses for electrical connection other than that for a test of IC package B.

Specific examples of the present invention have been described above in detail; however, those are presented merely as examples and do not limit the claims. The technologies disclosed in the claims include various deformations and modifications of the specific examples presented above.

The disclosure of U.S. provisional application No. 62/555,793, filed on Sep. 8, 2017, and the disclosure of U.S. provisional application No. 62/568,806, filed on Oct. 6, 2017, are all incorporated herein by reference in its entirety.

INDUSTRIAL APPLICABILITY

The electrical connection socket according to the present disclosure can stabilize the ground voltage of a metal housing and suppress signal degradation during signal transmission.

REFERENCE SIGNS LIST

1 Electrical connection socket
10 Metal housing
10a First through hole
10b Second through hole
10s Anodized region
10t Projecting portion
11 Signal pin
11a Pin barrel
11b First plunger
11c Second plunger
11d Spring
12 Ground pin
12a Pin barrel
12b First plunger
12c Second plunger
13a, 13b Holding member
B IC package
Ba First solder ball
Bb Second solder ball
P Circuit substrate
Pa First pad electrode
Pb Second pad electrode

The invention claimed is:

1. An electrical connection socket that relays an electric signal between a circuit substrate and an electric component, the electrical connection socket comprising:
a metal housing including a first through hole passing between an upper surface and a lower surface of the metal housing, the electric component being to be mounted on a side of the upper surface, the circuit substrate being to be disposed on a side of the lower surface; and
a signal pin inserted into the first through hole to constitute a coaxial line together with an inner wall surface of the first through hole, the signal pin including a first end to be electrically connected to a signal-path-use first pad electrode of the circuit substrate and a second end to be electrically connected to a signal-path-use first terminal of the electric component,
wherein the metal housing is disposed on the circuit substrate such that an air gap is formed between the lower surface of the metal housing and an upper surface of the circuit substrate,
the metal housing includes a plurality of projecting portions that project downward from the lower surface and that are disposed in contact with the upper surface of the circuit substrate, and
the air gap is formed in a region between the plurality of projecting portions.

2. The electrical connection socket according to claim 1, wherein the plurality of projecting portions project downward from the lower surface of the metal housing such that a height of the air gap is 0.1 mm or more.

3. The electrical connection socket according to claim 1, wherein a region of the air gap is 95% or more a region in which the lower surface of the metal housing and the upper surface of the circuit substrate face each other.

4. The electrical connection socket according to claim 1, wherein the plurality of projecting portions are disposed at least in regions at four corners of the lower surface of the metal housing.

5. The electrical connection socket according to claim 1, further comprising a ground pin inserted in a second through hole passing between the upper surface and the lower surface of the metal housing, the ground pin including a first end to be electrically connected to a ground-use second pad electrode formed on the circuit substrate and a second end to be electrically connected to a ground-use second terminal of the electric component.

6. The electrical connection socket according to claim 5, wherein the plurality of projecting portions are disposed to ground the metal housing by coming into contact with the ground-use second pad electrode formed on the circuit substrate.

7. The electrical connection socket according to claim 6, wherein the plurality of projecting portions each have a shape surrounding an edge portion of the second through hole at the lower surface of the metal housing.

8. The electrical connection socket according to claim 1, wherein the signal pin is inserted into the first through hole such that an outer circumferential surface of the signal pin is away from the inner wall surface of the first through hole.

9. The electrical connection socket according to claim 1, wherein the signal pin is configured to include a pin barrel fixed in the first through hole, and first and second plungers coupled to the pin barrel at an upper end portion and a lower end portion of the pin barrel, respectively, so as to be slidable in an up-down direction with respect to the pin barrel.

10. The electrical connection socket according to claim 1, wherein the electric component is an IC package.

* * * * *